(12) United States Patent
Parikh et al.

(10) Patent No.: US 9,099,584 B2
(45) Date of Patent: Aug. 4, 2015

(54) INTEGRATED THREE-DIMENSIONAL AND PLANAR METALLIZATION STRUCTURE FOR THIN FILM SOLAR CELLS

(75) Inventors: Suketu Parikh, San Jose, CA (US); Nevran Ozguven, Mountain View, CA (US); Duncan Harwood, Santa Clara, CA (US); Mehrdad M. Moslehi, Los Altos, CA (US)

(73) Assignee: Solexel, Inc., Milpitas, CA (US)

( * ) Notice: Subject to any disclaimer, the term of this patent is extended or adjusted under 35 U.S.C. 154(b) by 665 days.

(21) Appl. No.: 12/767,512

(22) Filed: Apr. 26, 2010

(65) Prior Publication Data

US 2010/0294356 A1 Nov. 25, 2010

Related U.S. Application Data

(60) Provisional application No. 61/172,335, filed on Apr. 24, 2009.

(51) Int. Cl.
| | |
|---|---|
| *H01L 31/00* | (2006.01) |
| *H01L 31/0352* | (2006.01) |
| *H01L 31/0224* | (2006.01) |
| *H01L 31/0236* | (2006.01) |
| *H01L 31/028* | (2006.01) |
| *H01L 31/0392* | (2006.01) |
| *H01L 31/18* | (2006.01) |

(52) U.S. Cl.
CPC ...... *H01L 31/035281* (2013.01); *H01L 31/028* (2013.01); *H01L 31/0236* (2013.01); *H01L 31/022433* (2013.01); *H01L 31/0392* (2013.01); *H01L 31/1804* (2013.01); *Y02E 10/547* (2013.01)

(58) Field of Classification Search
CPC .................. H01L 31/022433; H01L 31/0236
USPC ................................. 136/243–265
See application file for complete search history.

(56) References Cited

U.S. PATENT DOCUMENTS

| | | | |
|---|---|---|---|
| 4,043,894 A | 8/1977 | Gibbs | |
| 4,070,206 A | 1/1978 | Kressel et al. | |
| 4,082,570 A | 4/1978 | House et al. | |

(Continued)

FOREIGN PATENT DOCUMENTS

| | | | | |
|---|---|---|---|---|
| JP | 06-260670 | * | 9/1994 | ............ 136/256 |
| JP | 06-260670 A | | 9/1994 | |

(Continued)

OTHER PUBLICATIONS

Alvin D. Compaan, Photovoltaics: Clean Power for the 21st Century, Solar Energy Materials & Solar Cells, 2006, pp. 2170-2180, vol. 90, Elsevier B.V.

(Continued)

*Primary Examiner* — Jeffrey T Barton
*Assistant Examiner* — Niki Bakhtiari
(74) *Attorney, Agent, or Firm* — John Wood

(57) ABSTRACT

A three-dimensional structure having a mixture of inverted pyramidal cavities and substantially flat areas defines the frontside and backside of a substrate. The substantially flat areas have ridges forming base openings of the inverted pyramidal cavities and planar linear regions across the substrate. Pyramidal sidewalls define the pyramidal cavities from the ridges to pyramidal apices. Metallization contacts emitter regions on the frontside of the substantially flat areas.

8 Claims, 9 Drawing Sheets

(56) References Cited

U.S. PATENT DOCUMENTS

| | | | |
|---|---|---|---|
| 4,165,252 A | 8/1979 | Gibbs |
| 4,249,959 A | 2/1981 | Jebens |
| 4,251,679 A | 2/1981 | Zwan |
| 4,348,254 A | 9/1982 | Lindmayer |
| 4,361,950 A | 12/1982 | Amick |
| 4,409,423 A | 10/1983 | Holt |
| 4,427,839 A | 1/1984 | Hall |
| 4,461,922 A | 7/1984 | Gay et al. |
| 4,479,847 A | 10/1984 | McCaldin et al. |
| 4,626,613 A | 12/1986 | Wenham et al. |
| 4,672,023 A | 6/1987 | Leung |
| 4,922,277 A | 5/1990 | Carlson |
| 5,024,953 A | 6/1991 | Uematsu et al. |
| 5,073,230 A | 12/1991 | Maracas et al. |
| 5,112,453 A | 5/1992 | Behr et al. |
| 5,208,068 A | 5/1993 | Davis |
| 5,248,621 A | 9/1993 | Sano |
| 5,316,593 A | 5/1994 | Olson et al. |
| 5,348,618 A | 9/1994 | Canham et al. |
| 5,397,400 A | 3/1995 | Matsuno et al. |
| 5,459,099 A | 10/1995 | Hsu |
| 5,494,832 A | 2/1996 | Lehmann et al. |
| 5,538,564 A | 7/1996 | Kaschmitter |
| 5,645,684 A | 7/1997 | Keller |
| 5,660,680 A | 8/1997 | Keller |
| 5,681,392 A | 10/1997 | Swain |
| 5,704,992 A * | 1/1998 | Willeke et al. ............ 136/255 |
| 5,882,988 A | 3/1999 | Haberern et al. |
| 5,928,438 A | 7/1999 | Salami |
| 6,091,021 A | 7/2000 | Ruby |
| 6,096,229 A | 8/2000 | Shahid |
| 6,114,046 A | 9/2000 | Hanoka |
| 6,127,623 A | 10/2000 | Nakamura et al. |
| 6,204,443 B1 | 3/2001 | Kiso et al. |
| 6,294,725 B1 | 9/2001 | Hirschberg et al. |
| 6,331,208 B1 | 12/2001 | Nishida et al. |
| 6,399,143 B1 | 6/2002 | Chong |
| 6,416,647 B1 | 7/2002 | Dordi et al. |
| 6,429,037 B1 | 8/2002 | Wenham et al. |
| 6,441,297 B1 | 8/2002 | Keller et al. |
| 6,448,155 B1 | 9/2002 | Iwasaki et al. |
| 6,461,932 B1 | 10/2002 | Wang |
| 6,524,880 B2 | 2/2003 | Moon et al. |
| 6,534,336 B1 | 3/2003 | Iwane |
| 6,555,443 B1 | 4/2003 | Artmann et al. |
| 6,566,235 B2 | 5/2003 | Nishida et al. |
| 6,602,760 B2 | 8/2003 | Poortmans et al. |
| 6,602,767 B2 | 8/2003 | Nishida et al. |
| 6,613,148 B1 | 9/2003 | Rasmussen |
| 6,624,009 B1 | 9/2003 | Green et al. |
| 6,645,833 B2 | 11/2003 | Brendel |
| 6,649,485 B2 | 11/2003 | Solanki et al. |
| 6,653,722 B2 | 11/2003 | Blalock |
| 6,664,169 B1 | 12/2003 | Iwasaki et al. |
| 6,756,289 B1 | 6/2004 | Nakagawa et al. |
| 6,881,644 B2 | 4/2005 | Malik et al. |
| 6,946,052 B2 | 9/2005 | Yanagita et al. |
| 6,964,732 B2 | 11/2005 | Solanki |
| 7,022,585 B2 | 4/2006 | Solanki et al. |
| 7,026,237 B2 | 4/2006 | Lamb |
| 7,368,756 B2 | 5/2008 | Bruhns et al. |
| 7,402,523 B2 | 7/2008 | Nishimura |
| 2002/0153039 A1 | 10/2002 | Moon et al. |
| 2002/0168592 A1 | 11/2002 | Vezenov |
| 2002/0179140 A1 | 12/2002 | Toyomura |
| 2003/0017712 A1 | 1/2003 | Brendel |
| 2003/0039843 A1 | 2/2003 | Johnson |
| 2003/0124761 A1 | 7/2003 | Baert |
| 2004/0028875 A1 | 2/2004 | Van Rijn |
| 2004/0173790 A1 | 9/2004 | Yeo |
| 2004/0259335 A1 | 12/2004 | Narayanan |
| 2004/0265587 A1 | 12/2004 | Koyanagi |
| 2005/0160970 A1 | 7/2005 | Niira |
| 2005/0172998 A1 | 8/2005 | Gee et al. |
| 2005/0176164 A1 | 8/2005 | Gee et al. |
| 2005/0177343 A1 | 8/2005 | Nagae |
| 2005/0199279 A1 | 9/2005 | Yoshimine et al. |
| 2005/0274410 A1 | 12/2005 | Yuuki et al. |
| 2005/0281982 A1 | 12/2005 | Li |
| 2006/0021565 A1 | 2/2006 | Zahler et al. |
| 2006/0043495 A1 | 3/2006 | Uno |
| 2006/0054212 A1 | 3/2006 | Fraas et al. |
| 2006/0070884 A1 | 4/2006 | Momoi et al. |
| 2006/0105492 A1 | 5/2006 | Veres et al. |
| 2006/0196536 A1 | 9/2006 | Fujioka |
| 2006/0231031 A1 | 10/2006 | Dings et al. |
| 2006/0266916 A1 | 11/2006 | Miller et al. |
| 2006/0283495 A1 | 12/2006 | Gibson |
| 2007/0077770 A1 | 4/2007 | Wang et al. |
| 2007/0082499 A1 | 4/2007 | Jung et al. |
| 2008/0047601 A1 | 2/2008 | Nag et al. |
| 2008/0157283 A1 | 7/2008 | Moslehi |
| 2008/0210294 A1 | 9/2008 | Moslehi |
| 2008/0264477 A1 | 10/2008 | Moslehi |
| 2008/0289684 A1 | 11/2008 | Moslehi |
| 2008/0295887 A1 | 12/2008 | Moslehi |
| 2009/0042320 A1 | 2/2009 | Wang et al. |
| 2009/0107545 A1 | 4/2009 | Moslehi |
| 2009/0301549 A1 | 12/2009 | Moslehi |
| 2010/0022074 A1 | 1/2010 | Wang et al. |
| 2010/0116316 A1 | 5/2010 | Moslehi et al. |

FOREIGN PATENT DOCUMENTS

| | | |
|---|---|---|
| JP | 2002-2299661 A | 10/2002 |
| WO | PCT/EP1999/008573 | 5/2000 |

OTHER PUBLICATIONS

C.Berge, 150-mm Layer Transfer for Monocrystalline Silicon Solar Cells, Solar Energy Materials & Solar Cells, 2006, pp. 3102-3107, vol. 90, Elsevier B.V.

C.Oules et al, Silicon on Insulator Structures Obtained by Epitaxial Growth of Silicon over Porous Silicon, Journal of the Electrochemical Society, Inc., 1992, p. 3595, vol. 139, No. 12, Meylan Cedex, France.

C.S.Solanki, et al, Porous Silicon Layer Transfer Processes for Solar Cells, Solar Energy Materials & Solar Cells, 2004, pp. 101-113, vol. 83, Elsevier B.V., Leuven, Belgium.

C.S.Solanki, et al, Self-Standing Porous Silicon Films by One-Step Anodizing, Journal of Electrochemical Society, 2004, pp. C307-C314, vol. 151, The Electrochemical Society, Inc., Leuven, Belgium.

F.Duerinckx, et al, Reorganized Porous Silicon Bragg Reflectors for Thin-Film Silicon Solar Cells, IEEE Electron Device Letters, Oct. 2006, vol. 27, No. 10.

Francois J. Henley, Layer-Transfer Quality Cleave Principles, SiGen, 2005, Jul. 8, pp. 1-6, The Silicon Genesis Corporation, San Jose, California.

H.J.Kim, et al, Large-Area Thin-Film Free-Standing Monocrystalline Si Solar cells by Layer Transfer, Leuven, Belgium, IEEE.

J.H.Werner et al, From Polycrystalline to Single Crystalline Silicon on Glass, Thin Solid Films, 2001, pp. 95-100, vol. 383, Issue 1-2, Elsevier Science B.V., Germany.

J.J. Schermer et al., Epitaxial Lift-Off for large area thin film III/V devices, phys. Stat. sol. (a) 202, No. 4, 501-508 (2005).

Jianhua Zhao, et al, A 19.8% Efficient Honeycomb Multicrystalline Silicon Solar Cell with Improved Light Trapping, IEEE Transactions on Electron Devices, 1999, vol. 46, No. 10.

K. Van Nieuwenhuysen et al., Progress in epitaxial deposition on low-cost substrates for thin-film crystalline silicon solar cells at IMEC, Journal of Crystal Growth, 2006, pp. 438-441, vol. 287, Elsevier B.V., Leuven, Belgium.

K.L. Chopra et al., Thin-Film Solar Cells: An Overview, Progress in Photovoltaics: Research and Applications, 2004, pp. 69-92, vol. 12, John Wiley & Sons, Ltd.

Lammert et al., The Interdigitated Back Contact Solar Cell: A Silicon Solar Cell for Use in Concentrated Sunlight, IEEE Transactions on Electron Devices, pp. 337-342.

MacDonald et al., "Design and Fabrication of Highly Topographic Nano-imprint Template for Dual Damascene Full 3-D Imprinting," Dept. of Chemical Eng., University of Texas at Austin, Oct. 24, 2005.

(56) References Cited

OTHER PUBLICATIONS

Martin A. Green, Consolidation of Thin-Film Photovoltaic Technology: The Coming Decade of Opportunity, Progress in Photovoltaics: Research and Applications, 2006, pp. 383-392, vol. 14, John Wiley & Sons, Ltd.

Martin A. Green, Silicon Photovoltaic Modules: A Brief History of the First 50 Years, Progress in Photovoltaics: Research and Applications, 2005, pp. 447-455, vol. 13, John Wiley & Sons, Ltd.

Nobuhiko Sato et al, Epitaxial Growth on Porous Si for a New Bond and Etchback Silicon-on-Insulator, Journal of Electrochemical Society, Sep. 1995, vol. 142, No. 9, The Electrochemical Society, Inc., Hiratsuka, Japan.

P.J.Verlinden, et al, Sliver® Solar Cells: A New Thin-Crystalline Silicon Photovoltaic Technology, Solar Energy Materials & Solar Cells, 2006, pp. 3422-3430, vol. 90, Elsevier B.V.

P.R. Hageman et al., Large Area, Thin Film Epitaxial Lift Off III/V Solar Cells, 25th PVSC, 1996, May 13-17, Washington D.C., IEEE.

Photovoltaic Technology Research Advisory Council, A Vision for Photovoltaic Technology, 2005, pp. 1-41, European Commision Publications Office.

Prometheus Institute, U.S. Solar Industry Year in Review: U.S. Solar Energy Industry Charging Ahead, (SEIA) The Solar Energy Industry Association.

R.Brendel, et al, Sol-Gel Coatings for Light Trapping in Crystalline Thin Film Silicon Solar Cells, Journal of Non-Crystalline Solids, 1997, pp. 391-394, vol. 218, Elsevier Science B.V., Germany.

Richard Auer et al, Simplified Transfer Process for High-Current Thin-Film Crystalline Si Solar Modules, 3rd World Conference on Photovoltaic Energy Conversion, May 11-18, 2003, Osaka, Japan.

Richard M. Swanson, A Vision for Crystalline Silicon Photovoltaics, Progress in Photovoltaics: Research and Applications, 2006, pp. 443-453, vol. 14, John Wiley & Sons, Ltd.

Rolf Brendel, A Novel Process for Ultrathin Monocrystalline Silicon Solar Cells on Glass, 14th European Photovolaic Solar Energy Conference, Jun. 30-Jul. 4, 1997, Barcelona, Spain.

Rolf Brendel, Review of Layer Transfer Processes for Cystalline Thin-Film Silicon Solar Cells, The Japan Journal of Applied Physics, 2001, pp. 4431-4439, vol. 40, Part 1, No. 7, The Japan Society of Applied Physics, Japan.

Rolf Brendel, Thin-Film Crystalline Silicone Mini-Modules Using Porous Si for Layer Transfer, Solar Energy, 2004, pp. 969-982, vol. 77, Elsevier Ltd., Germany.

S. Hegedus, Thin Film Solar Modules: The Low Cost, High Throughput and Versatile Alternative to Si Wafers, Progress in Photvoltaics: Research and Applications, 2006, pp. 393-411, vol. 14, John Wiley & Sons, Ltd.

Takao Yonehara, et al, Epitaxial Layer Transfer by Bond and Etch Back of Porous Si, Applied Physics Letter 64, Apr. 18, 1994, vol. 16, American Institute of Physics.

Toshiki Yagi, et al, Ray-Trace Simulation of Light Trapping in Silicon Solar Cell with Texture Structures, Solar Energy Materials & Solar Cells, 2006, pp. 2647-2656, vol. 90, Elsevier B.V.

\* cited by examiner

INTEGRATED THREE-DIMENSIONAL AND PLANAR METALLIZATION STRUCTURE FOR THIN FILM SOLAR CELLS

CROSS REFERENCE TO RELATED APPLICATIONS

This application claims priority to U.S. Provisional Patent Application Ser. No. 61/172,335, filed Apr. 24, 2009, which is hereby incorporated by reference in its entirety for all purposes.

FIELD

This disclosure relates in general to the field of photovoltaics and solar cells, and more particularly to three-dimensional (3-D) thin-film solar cells (TFSCs) and methods for manufacturing the same.

BACKGROUND

Renewable, high-efficiency, and cost-effective sources of energy are becoming a growing need on a global scale. Increasingly expensive, unreliable, and environmentally risky fossil fuels and a rising global demand for energy, including electricity, have created the need for alternate, secure, clean, widely available, cost-effective, environmentally friendly, and renewable forms of energy. Solar photovoltaic (PV) electricity generation using solar cells is uniquely suited to meet the needs of residential, commercial, industrial, and centralized utility applications. Key attributes that make solar energy attractive are the abundant, worldwide, point-of-use supply of sunlight, environmental friendliness, scalability (from milliwatts to megawatts), secure point-of-use generation of solar electricity, and excellent distributed energy economics. The sun provides more energy to the earth in one hour than the annual energy consumption of the entire world. Much of the earth's surface receives a significant amount of annual sun-hours which may be effectively harnessed for clean and secure electricity generation. A key driver for this market pull is a rising public awareness of environmentally benign technologies. However, due to relatively low solar cell efficiencies (e.g., less than 12% for most thin-film technologies and roughly 12% to 18% for most crystalline silicon solar cell technologies), high costs of raw materials (e.g., silicon for crystalline silicon wafer solar cells) and manufacturing processes, limitations on cost-effective and efficient electrical storage, and a general lack of infrastructure to support solar cell proliferation, to date there has been limited use of this energy solution (currently, electricity generation by solar photovoltaics accounts for less than 0.1% of total worldwide electricity generation).

For commercial applications, cost of energy to the end-user (e.g., in cents/kWh for electricity) should be sufficiently low and comparable to or even better than that from utility grids using conventional electricity generation sources. The solar photovoltaic electricity generation, which currently accounts for less than 0.1% of the global electricity generation, may be substantially expanded if it achieves cost parity with conventional grid electricity. As the costs of solar cells and modules (typically expressed as $/W_p$) are reduced, grid-tied solar photovoltaic applications are gaining acceptance at an accelerated pace, making them an attractive option for significant proliferation in electricity generation.

In the price-sensitive solar cell market, two principal technology options exist. On the one hand, crystalline silicon (c-Si) wafers may serve as the basis for solar cell formation (currently accounting for more than 90% of the solar PV market). On the other hand, thin-film (amorphous and polycrystalline) technologies using silicon and other semiconductor absorber materials (such as amorphous silicon, CdTe, or CIGS) may offer significant cost advantages compared to crystalline silicon wafer-based solar cells. These different approaches are at opposite ends of the price-performance scale. Crystalline silicon wafers offer higher performance, but at higher costs (due to the relatively high cost of starting monocrystalline and multicrystalline silicon wafers). Thin-film technologies may offer lower manufacturing costs, but typically at lower performance levels (i.e., lower efficiencies). For both approaches, the price-per-watt typically increases as cell efficiencies rise (due to higher material and/or manufacturing costs).

Due to a rapid annual growth rate of more than 40% during the past ten years and the concurrent demands for silicon material by both semiconductor microelectronics and solar PV industries, the solar PV industry has been experiencing a shortage of polysilicon feedstock supply. The polysilicon feedstock shortage has significantly constrained the solar PV industry growth, particularly during the past several years. In fact, the solar cell industry currently consumes over half of the worldwide production of high-purity polysilicon feedstock. Within the last few years, the contract price of polysilicon has increased from roughly $30/kg to roughly $85/kg, with spot prices exceeding $250/kg. This has led to large increases in the price of monocrystalline and multicrystalline silicon wafers, which now account for roughly half of the total solar module manufacturing cost.

The trend in the mainstream crystalline silicon (c-Si) wafer solar cell industry has been to scale down wafer thicknesses to below 200 microns (in order to reduce the amount of silicon material in grams used per watt of solar cell rated peak power). For example, monocrystalline silicon wafer solar cells are projected to scale down to a thickness of roughly 120 microns by 2012, from a current wafer thickness of roughly 200 microns. Multicrystalline silicon wafer solar cells are projected to scale down to a thickness of roughly 180 microns by 2012, from a current average wafer thickness of roughly 260 microns. This wafer thickness reduction, however, presents additional challenges related to mechanical rigidity, manufacturing yield, and solar cell efficiency. Despite its high cost, crystalline silicon (c-Si) technology still dominates the solar cell market, mainly due to higher efficiencies and synergies with the established microelectronics industry and supply chain. Currently, c-Si accounts for slightly over 90% of the solar cell market (95% when ribbon silicon is included).

Historically, crystalline silicon solar cells have achieved a 20% cost reduction for each doubling of cumulative global cell production (measured in megawatts or $MW_p$ and gigawatts or $GW_p$). It is projected that through innovative cost reduction and efficiency enhancement methods, the cost of electricity derived from grid-connected rooftop solar photovoltaic modules may become comparable to the cost of electricity purchased from the utility grid in five to ten years. A 2005 survey of the commercially available monocrystalline silicon and multicrystalline silicon solar modules reports the solar module efficiencies then in the range of 9.1% to 16.1%, with a median efficiency value of about 12.5%. Commercial crystalline silicon modules usually show a rapid initial efficiency degradation of 1% to 3% (relative) due to various effects, including photodegradation effects in wafered solar cells (e.g., wafer minority carrier lifetime degradation). Monocrystalline silicon wafer solar cell efficiencies are projected to increase to roughly 20.5% by 2012, from a current efficiency of roughly 16.5% (leading-edge commercially available monocrystalline silicon solar cell and solar module efficiencies are currently about 21.5% and 18%, respectively). Multicrystalline silicon wafer solar cell efficiencies are projected to increase to roughly 18% by 2012, from a current efficiency level of roughly 15.5%.

State-of-the-art crystalline silicon solar cell manufacturing currently uses about 10 grams of high-purity polysilicon feedstock per peak watt ($g/W_p$), resulting in a polysilicon feedstock material cost of about $0.85/$W_p$ (assuming a polysilicon price of $85/kg). Over the next five years, the projected trends of solar cell wafer thickness reduction (e.g., to less than 200 micron wafers) and a long-term assumed price of about $20/kg for solar-grade polysilicon may reduce the polysilicon feedstock cost (in $g/W_p$) by about a factor of four to eight to about $0.10/$W_p$ to $0.20/$W_p$. Thus, any competing solar cell technologies should benchmark their manufacturing cost goals against this reduced raw material cost number. For a given cell efficiency, silicon wafer thickness reduction presents a prime opportunity for solar cell cost reduction by reducing the amount of polysilicon feedstock consumed per watt of peak solar power.

The cost associated with wire saws, amounting to about $0.25/$W_p$ for current silicon solar cells provides another wafer-related cost component for silicon wafer solar cells. Innovative and cost-effective technologies that eliminate the kerf losses associated with sawing and slicing should further facilitate silicon solar cell cost reductions. It is projected that the wafer-based crystalline silicon solar module manufacturing cost (which is currently on the order of $2.10 per watt to more than $2.70 per watt) may be reduced to the range of roughly $1.50/$W_p$ to $1.80/$W_p$ by the year 2012, in part due to wafer sawing kerf loss reduction to roughly 130 microns by 2012 from the current value of roughly 200 microns. The overall cost reductions for wafer-based crystalline silicon solar cells may come from various sources including: lower cost polysilicon feedstock, thinner wafers, higher cell-level efficiencies, reduced wafer sawing kerf losses, and increased economy of scale or manufacturing volume.

State-of-the-art silicon wafer solar cell fabrication facilities ("solar fabs") typically produce 125 mm×125 mm up to 156 mm×156 mm solar cells today. The trend in crystalline silicon wafer solar cells is toward thinner and larger wafers. The monocrystalline and cast (as well as ribbon) multicrystalline silicon solar cell wafer thicknesses in leading-edge solar cells used for power generation modules are projected to be reduced to around 150 and 200 microns, respectively, by around 2009-2010. Any cost-effective, high-efficiency, innovative silicon solar cell technology which enables a substantial reduction of the silicon material consumption (e.g., wafer or film thickness) per $W_p$ of cell power compared to the above-mentioned current and projected 2009-2010 numbers may offer significant promise as a viable commercial solar cell technology for solar photovoltaic applications (e.g., residential, commercial, and industrial rooftop as well as large-scale centralized utilities electrical power generation applications).

Higher solar cell efficiencies have favorable effects on the entire solar cell value chain and levelized cost of energy (LCOE in $/kWh) due to reduced material consumption and cost as well as reduced balance-of-system (BOS) costs (e.g., area-related solar module installation and inverter costs). The current mainstream commercial crystalline solar cells provide efficiencies on the order of 14% to 17%. It is expected that the projected crystalline silicon solar cell efficiencies in commercial solar cells may approach around 19% and 17% for monocrystalline and multicrystalline silicon solar cells, respectively, by the year 2009. A key area for new solar cell business opportunities is development of innovative cell structures and simplified process flows which may drive efficiencies up while lowering overall solar cell and module manufacturing costs. For alternative (e.g., thin-film PV) approaches to succeed over the mainstream wafer-based crystalline silicon solar cell technologies, they should provide higher efficiencies at even lower manufacturing costs compared to the projected efficiency and cost numbers for the mainstream wafer-based crystalline silicon solar cells when the new technology is fully commercialized.

Economy-of-scale fab cost reduction associated with high-volume solar fab capacities is a key factor impacting LCOE. The state-of-the-art high-volume solar photovoltaic fabs have annual production capacities on the order of or in excess of 50 $MW_p$ to 100 $MW_p$ ($MW_p$=1 million $W_p$). High-volume solar photovoltaic fab capacities are expected to increase substantially to annual production rates of several hundred $MW_p$ or even approaching 1 $GW_p$ ($GW_p$=1 billion $W_p$) in the coming decade. While very-high-volume solar fabs in the range of 100 $MW_p$ to 1 $GW_p$ should facilitate longer term cost reductions (including LCOE) through high-volume manufacturing economies of scale, the relatively high initial fab investment costs, which may easily exceed $100M, may impose certain limits on solar photovoltaic fab construction options. Ideally, the preference may be to develop innovative crystalline silicon solar cell designs and simplified manufacturing processes which facilitate substantial manufacturing cost reductions in solar cells and modules even in smaller-scale (and less capital-intensive) fabs with modest production volumes (e.g., annual production volumes in the range of 5 $MW_p$ to 50 $MW_p$). This type of technology would allow for modest-volume solar photovoltaic fabs with modest fab setup and operation costs. Reduced fab setup and operation costs would further facilitate global proliferation of cost-effective solar modules, enabling construction of a multitude of very affordable modest-volume fabs (in contrast to having to set up very expensive high-volume fabs in order to achieve sufficient economy of scale for manufacturing cost reduction). Of course, an innovative solar cell technology that meets the above-mentioned criteria for cost-effective, modest-volume fabs (i.e., meeting the LCOE roadmap requirements even at modest production volumes in low-cost fabs set up for simplified solar cell processing), may also be applicable to very-high-volume (e.g., greater than 100 $MW_p$) solar fabs. Such solar photovoltaic fabs can take further advantage of the economies of scale associated with increased volume.

Thin-film solar cell (TFSC) technologies (e.g., amorphous silicon, CdTe, and CIGS) require little absorber material (usually much less than 10 microns in thickness) to absorb typical standard "Air Mass 1.5" (AM-1.5) solar illumination due to absorption bands that are well matched to the solar spectrum. The TFSC absorber material may be deposited on inexpensive substrates such as glass or flexible metallic or non-metallic substrates. TFSCs typically offer low cost, reduced module weight, reduced materials consumption, and a capability for using flexible substrates, but are usually much lower in efficiency (e.g., usually 5% to 12%). In the case of prior art thin crystalline silicon films, there are a number of major problems and challenges with the use of flat silicon films (such as epitaxially grown silicon films with thicknesses below 50 microns) for low-cost, high-performance solar cells. These include: relatively low solar module efficiencies (typically 7% to 12%), field degradation of module efficiencies, scarce and expensive absorber materials (e.g., In and Se for CIGS and Te for CdTe), limited validation of system field reliability, and adverse environmental impact of non-silicon technologies such as CIS/CIGS and CdTe.

With regard to the prior art crystalline silicon (c-Si) thin-film solar cell (TFSC) technology, there are difficulties associated with sufficient surface texturing of the thin silicon film to reduce surface reflectance losses, while reducing the crystalline silicon film thickness. This places a limit on the minimum flat (co-planar) monocrystalline silicon thickness due to production yield and cell performance (efficiency) considerations. In the case of a flat or co-planar film, it may be advantageous to use surface texturing since the reflectance of an untextured crystalline silicon film is quite excessive (can be greater than 30%) and results in substantial optical reflection losses and degradation of the external quantum efficiency. Thus, reduction of reflectance-induced photon losses in co-planar epitaxial silicon films may be achieved by surface texturing, which itself places a limit on the minimum epitaxial silicon layer thickness. Depending on the film surface texturing requirements and processes, the minimum crystalline silicon layer thickness may be on the order of at least 10 microns (so that the texturing process does not break through any portions of the crystalline silicon layer).

In addition, substantially reduced mean optical path lengths in thin planar crystalline silicon films result in reduced photon absorption, particularly for photons with energies near the infrared bandgap of silicon (800 to 1100 nanometers), resulting in reduced solar cell quantum efficiency (reduced short-circuit current or $J_{sc}$). This results in serious degradation of the solar cell efficiency due to reduced cell quantum efficiency and reduced $J_{sc}$. For instance, in a co-planar (flat) crystalline silicon absorber layer with thickness of 20 microns, a solar light beam impacting the cell at a near-normal angle would have an effective path length equal to the film thickness, far too short for the solar radiation photons with energies near the infrared bandgap of silicon (i.e., with wavelengths of roughly 800 to 1100 nanometers) to be absorbed effectively in the silicon thin film. In fact, a reduction of the active cell silicon thickness to below roughly 50 microns results in appreciable reduction of $J_{sc}$ and the resulting solar cell efficiency, with this degradation effect rapidly accelerating when the silicon film thickness is reduced below roughly 20 microns. Thus, a co-planar thin crystalline silicon film may also require effective light trapping using both top surface texturing and rear surface back reflection of the light exiting the back surface of the crystalline silicon film in order to create effective optical path lengths equal to a large multiple of the crystalline silicon film thickness.

The prior art technologies using this approach mostly use either back reflection through internal reflection of the light at the crystalline silicon film/silicon substrate, or reflection from a blanket backside contact (such as a back surface field aluminum contact/mirror). The back reflectance provided by these techniques may not be great (e.g., roughly 70% effective near-IR rear reflectance), constraining the performance gain that would have otherwise been achieved by an optimal back reflector. The problem with this approach is that the primary incident beam always passes the crystalline silicon film only once. Any subsequent second passes of the primary incident beam photons are dependent on the back surface reflection.

There is also the problem of lack of rigidity and mechanical support of the thin film during cell and module processing steps. This problem relates to the mechanical strength of a large-area (e.g., 200 mm×200 mm) thin silicon film. It is well known that reducing the large-area crystalline silicon wafer thickness to below 100 microns results in a substantial loss of cell substrate mechanical strength/rigidity, and such thin wafers tend to be flexible and very difficult to handle without breakage during cell fabrication process flow.

Large-area, co-planar (flat) crystalline silicon films thinner than, for instance, 50 microns must be properly mounted and supported on a cost-effective support or handle substrate in order to achieve acceptable yield for solar cell and module manufacturing. One approach is to grow and retain the thin epitaxial film on a relatively low-cost (e.g., metallurgical-grade) silicon substrate (over which the epitaxial layer is grown); however, this approach suffers from some inherent problems constraining the ultimate solar cell efficiency. Another approach is to release or lift off the epitaxial silicon film from its (reusable) parent silicon substrate and subsequently place it on a cheaper non-silicon support or handle substrate to provide mechanical strength through the solar cell process flow. This approach may suffer from any thermal coefficient of expansion (TCE) mismatch between the support/handle substrate and silicon film during any high-temperature oxidation and anneal processes, as well as potential contamination of the thin epitaxial silicon film from the non-silicon support substrate (both creating possible manufacturing yield and performance/efficiency degradation problems).

The cost of the monocrystalline silicon film growth process using silicon epitaxy, particularly for thicker epitaxial films with thicknesses in excess of 30 microns is an additional issue which should be addressed. Using a relatively small epitaxial film thickness (in one embodiment, much below 30 microns) may lower the cost of epitaxy to an attractive range. However, this would present various challenges for fabrication of planar silicon thin-film solar cells. As stated, thinner co-planar (flat) epitaxial films (e.g., in the range of much less than 30 microns) produce a number of problems and challenges, including a lack of film mechanical strength, constraints limiting effective surface texturing of thin silicon films for low surface reflectance and reduced optical reflectance losses, relatively short optical path lengths, and reduced cell quantum efficiencies. Effective light trapping is essential for enhanced thin-film c-Si solar cell efficiencies. The requirement for effective light trapping is based on a combination of front surface texturing and back surface mirror, while achieving sufficiently low surface recombination velocities (for high cell efficiencies). This is very difficult to achieve in the co-planar (flat) c-Si thin film solar cells.

High-performance c-Si thin-film solar cells require some patterning steps or patterned processing steps (e.g., for formation of selective emitter, frontside emitter or backside emitter wrap-through metallization contacts, backside base metallization contacts, etc.). These patterning steps are usually achieved using photolithography, screen printing, and/or shadow-mask deposition (e.g., shadow-mask sputtering or evaporation) processes. The use of photolithography and/or screen printing and/or shadow-mask deposition patterning steps usually increases the manufacturing process flow complexity and cost, and may also detrimentally impact the fabrication yield as well as the ultimate achievable solar cell efficiency.

SUMMARY

Embodiments of the present disclosure are directed to systems and methods that are further described in the following description and claims. Advantages and features of embodiments of the present disclosure may become apparent from the description, accompanying drawings and claims.

According to one embodiment of the present disclosure a thin-film solar cell (TFSC) which substantially addresses the problems identified above is provided.

Embodiments of the present disclosure also substantially address shortcomings of existing mainstream c-Si solar cell technology. This includes reducing the amount of polysilicon feedstock consumed per peak watt of solar power, and eliminating the kerf losses associated with sawing and slicing, thus substantially reducing the overall solar cell manufacturing cost.

Embodiments of the present disclosure also substantially address requirements for innovative solar cell structures and simplified process flows, increasing cell and module efficiencies while significantly lowering the overall solar cell and module manufacturing costs. A still further need exists for innovative c-Si solar cell designs and simplified self-aligned manufacturing processes which facilitate substantial solar cell and module cost reduction even in fabs with modest production volumes, enabling low to mid-volume solar cell fabs with modest fab setup and operation costs (thus achieving economies of scale for manufacturing cost reduction at substantially lower fab volumes than the prior art fabs).

Embodiments of the present disclosure also substantially address shortcomings of existing TFSC technology. This includes addressing difficulties associated with sufficient surface texturing of the thin planar silicon films to reduce surface reflectance losses, which currently places a limit on the minimum flat (co-planar) crystalline silicon thickness due to production yield and cell performance considerations. A still further need exists for effective light trapping based on a combination of front surface texturing and back surface mirror, while achieving low surface recombination velocities (for high cell efficiencies).

Additional shortcomings of existing TFSC technologies include the problem of lack of rigidity and mechanical support of the thin film substrate during cell and module processing steps, thus, necessitating the use of support or handle substrates (made of silicon or another material) for the TFSC substrates. This further includes the cost of the epitaxial silicon film growth process, particularly for thicker epitaxial films required for planar crystalline silicon TFSCs. This further includes the requirement of multiple photolithography and/or screen printing and/or shadow-mask processing/patterning steps which usually increase the manufacturing process flow complexity and cost, and may also detrimentally impact the fabrication yield as well as the ultimate achievable solar cell efficiency.

BRIEF DESCRIPTION OF THE SEVERAL VIEWS OF THE DRAWINGS

The features, nature, and advantages of the disclosed subject matter may become more apparent from the detailed description set forth below when taken in conjunction with the drawings, in which like reference numerals indicate like features and wherein.

DETAILED DESCRIPTION

Embodiments of the present disclosure are illustrated in the FIGURES, like numerals being used to refer to like and corresponding parts of the various drawings.

A method operable to produce integrated three-dimensional and planar metallization structure for thin film solar cells is provided. This method involves depositing a thin film on a template mask, the template mask having substantially flat and three-dimensional topographical areas. The thin film is then released from the template mask. Emitters are formed on the thin film. Finally, metallization of the substantially flat areas takes place. In some embodiments, the substantially flat areas may be linear regions on the surface of the thin film.

Embodiments of the present disclosure provide a method of forming a thin film substrate having both planar and three dimensional topographical areas. The method may involve depositing a thin film on a template mask having both substantially flat or planar areas as well three dimensional topographical areas. This thin film after deposition may be released from the template mask. Emitters may be formed on the thin film, and metal lines may be aligned to the planar areas to provide contact formation and low line resistance, thereby achieving improved FF in comparison to lines which must contour to the three dimensional structure.

FF, or fill factor, refers to the ratio of the actual peak output power to the theoretical maximum power.

$$FF = J_{mpp} V_{mpp} / J_{sc} V_{oc}$$

Where $J_{mpp}$ and $V_{mpp}$ refer to the current and voltage, respectively, at the maximum power point; $J_{sc}$ is as previously defined; and $V_{oc}$ refers to the open-circuit voltage.

The three dimensional areas are provided for enhanced light trapping while the area of metallization of the planar areas for a given line resistance is reduced and short circuit currents ($J_{sc}$) are improved. The structure may be created on the freestanding film substrate with a template wafer, thereby replicating the same structure repeatedly without the need for an additional mask.

Figure 1:
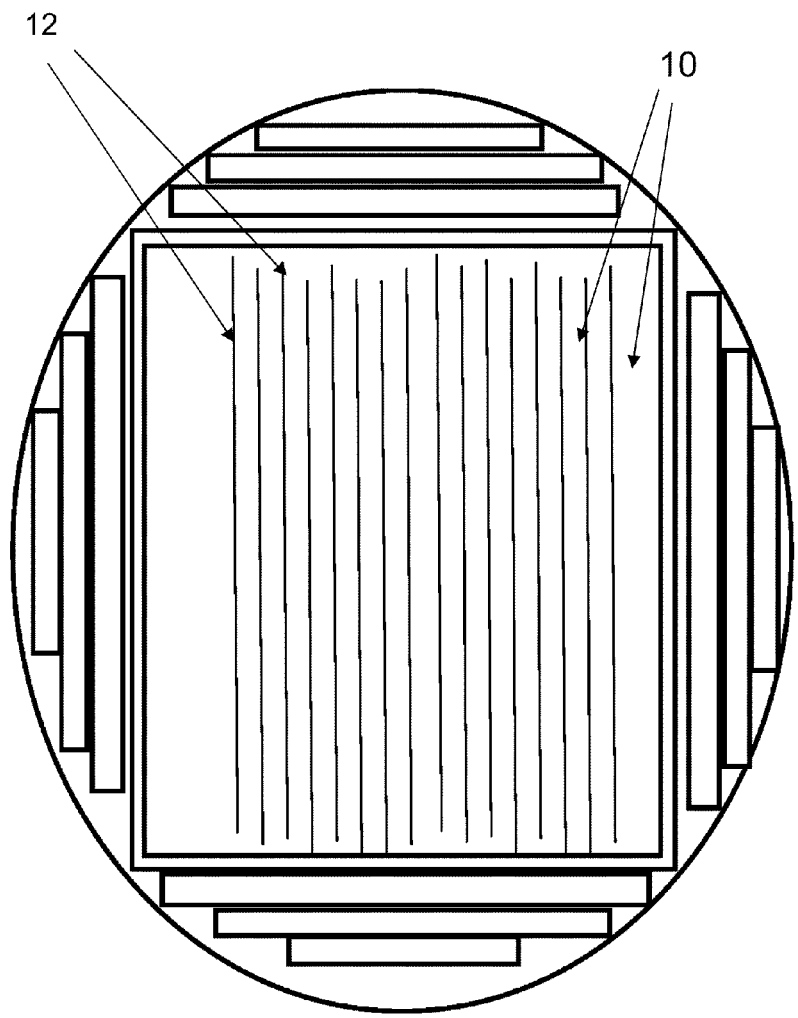
FIG. 1 provides a top down view of a template mask that may be used in accordance with embodiments of the present disclosure.
Figure 2:
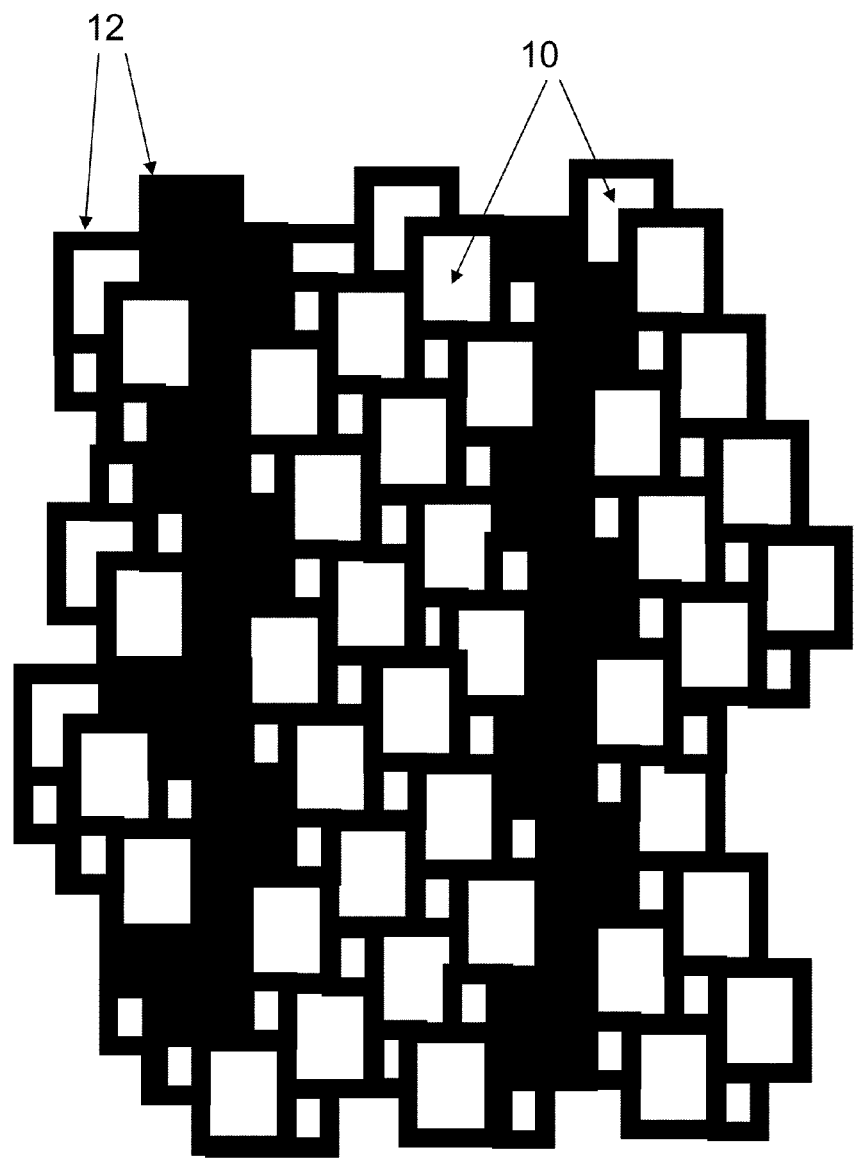
FIG. 2 provides a top down view of a callout of the template mask of FIG. 1 that may be used in accordance with embodiments of the present disclosure.

FIG. 1 provides a top down view of a template mask that may be used in accordance with embodiments of the present disclosure. The mask in FIG. 1 may contain three-dimensional areas 10 having tile structures, small pyramids, or a pyramidal design and rounded corners. The mask may also have flat areas 12, having no pattern, as shown in the callout provided by FIG. 2. Flat areas 12 may comprise small squares or rectangles surrounding the three-dimensional areas, and they may be offset from one another to prevent crack formation and propagation. They may also comprise larger linear regions, as shown. Flat areas 12 may be more prominent than three-dimensional areas 10, for metallization purposes. One benefit of this disclosure is that metal coverage on the ridges of a three dimensional structure may be reduced from about 10-15 percent to about 6-8 percent. This may reduce the metal shading of the underlying active area, thereby increasing the short circuit current without increasing the series resistance of the metallization to where it significantly impacts the fill factor of the cell. Also since the thin film may be printed using a template mask or wafer, the nitride thickness may be controlled on flat areas, ensuring a more uniform thickness of passivation for fire through, thereby avoiding localized over- or under-firing of the metal.

Figure 3:
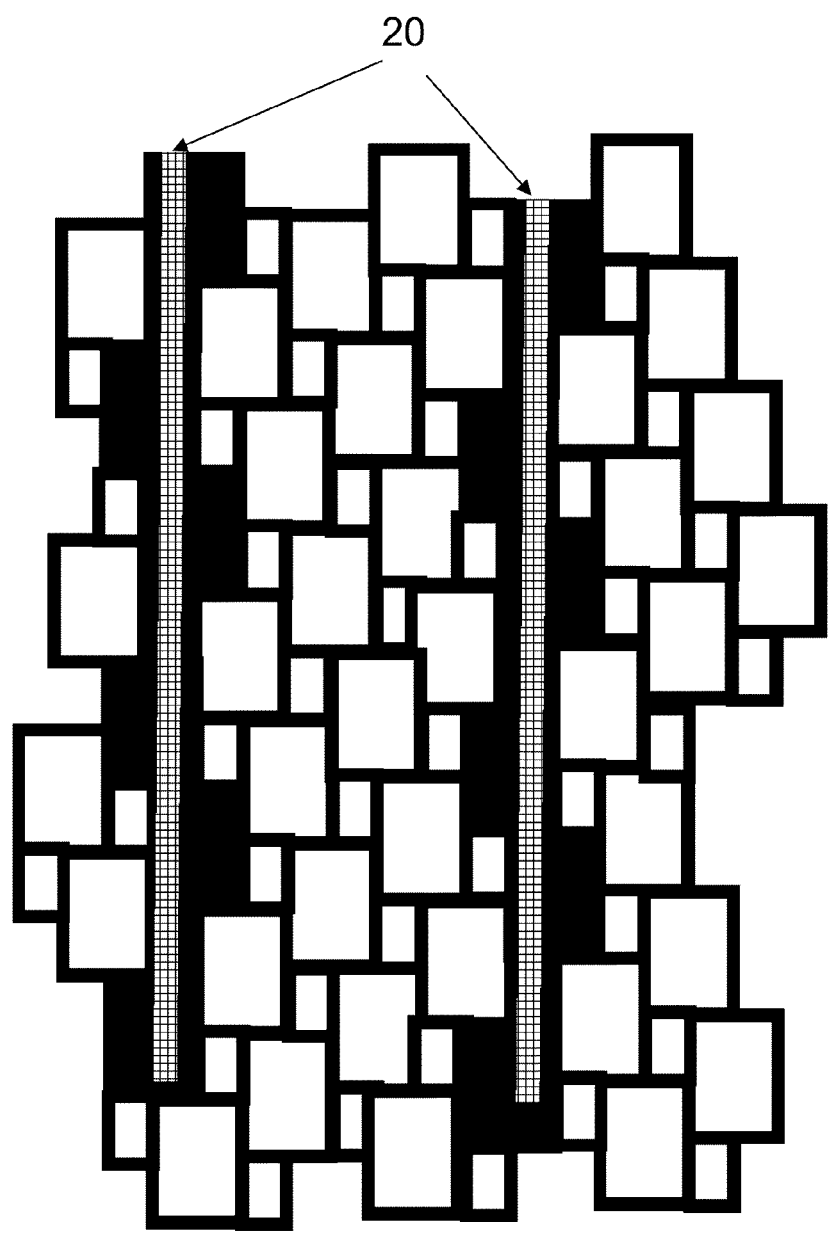
FIG. 3 provides a top down view of screen-printed lines in flat areas on the TFSS provided in accordance with an embodiment of the present disclosure.

FIG. 3 depicts screen-printed lines 20 in flat areas on the TFSS provided in accordance with an embodiment of the present disclosure. This may contain flat areas with no pattern. The standard cell may be large.

Figure 4:
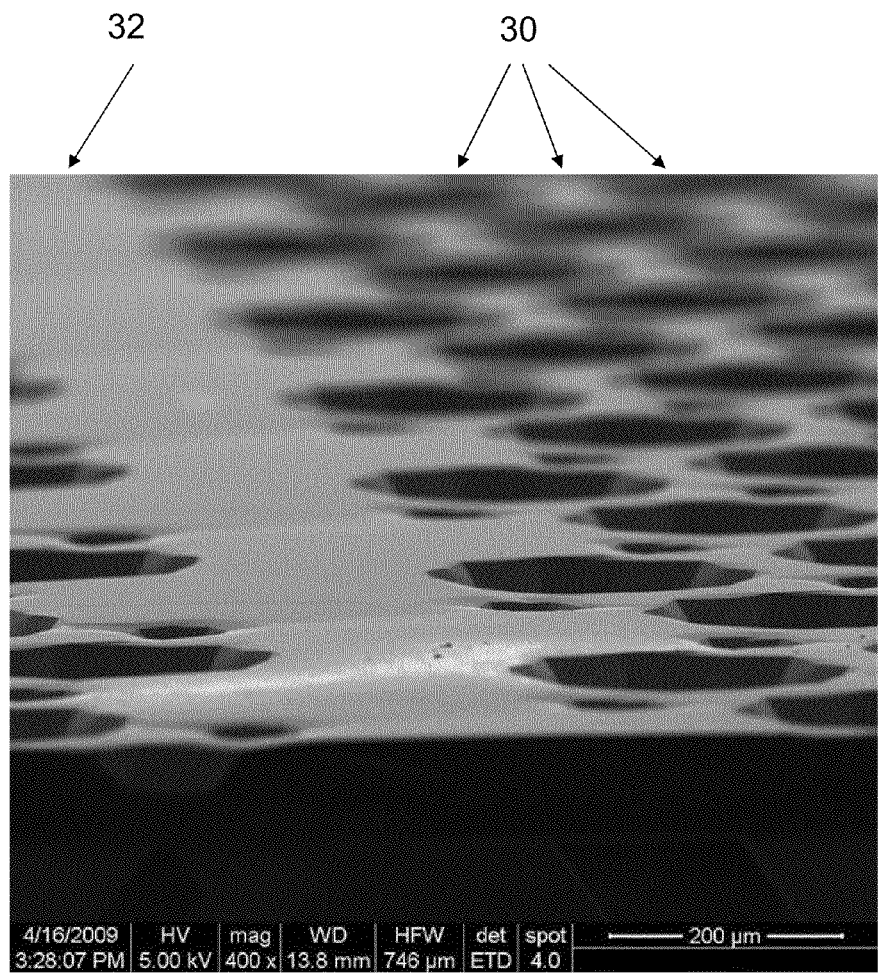
FIG. 4 provides a scanning electron micrograph of a released TFSS topside in accordance with an embodiment of the present disclosure.

FIG. 4 provides a scanning electron micrograph of a released TFSS topside in accordance with an embodiment of the present disclosure. As discussed, three-dimensional areas 30 are below the level of flat area 32, for the sake of metallization.

Figure 5:
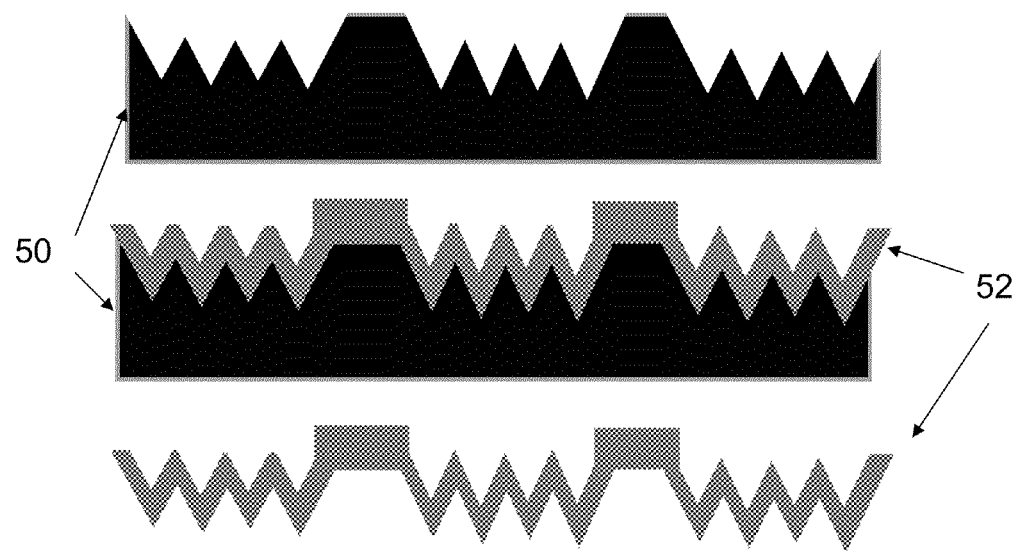
FIG. 5 and FIG. 6 provide a schematic flow from the processes associated with embodiments of the present disclosure.
Figure 6:
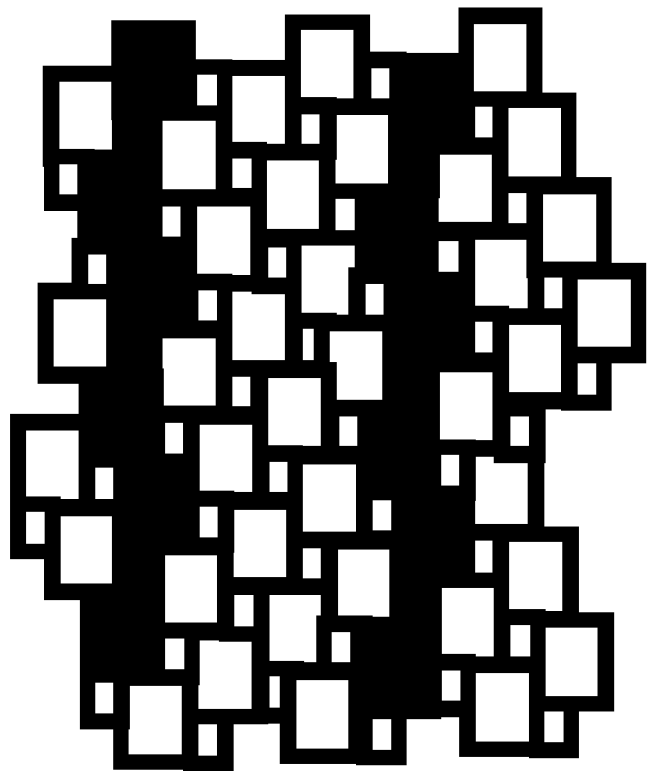

FIG. 5 and FIG. 6 provide a schematic flow from the processes associated with embodiments of the present disclosure. In FIG. 5, the process begins with template 50 having areas of both flat and three-dimensional topography. Then a thin film such as, but not limited to, an epi silicon deposition may be deposited on the template mask. This will produce thin film silicon substrate 52, which may be released as shown. To facilitate the release of substrate 52, a layer of porous silicon may first be deposited on template 50, then etched after deposition of substrate 52; alternatively, substrate 52 may be released from template 50 in other known ways. FIG. 6 shows a top view of released substrate 52 and continues the process of the schematic flow wherein emitters form and passivation is applied to the TFSS in known ways; then metallization on the flat areas, which may be self-aligned, is allowed to occur.

Figure 7A:
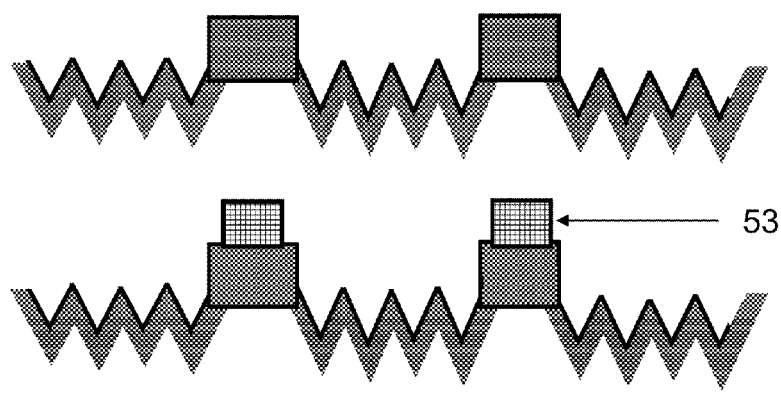
FIG. 7A and FIG. 7B show a side and a top down view, respectively, of a substrate in accordance with the present disclosure after metallization has been applied.
Figure 7B:
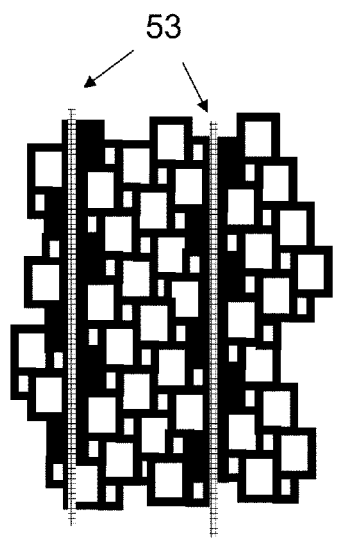

FIG. 7A shows a side view of substrate 52 before and after metallization 53 has been applied to the flat areas. FIG. 7B shows a top view of the substrate of FIG. 7A.

Figure 8A:
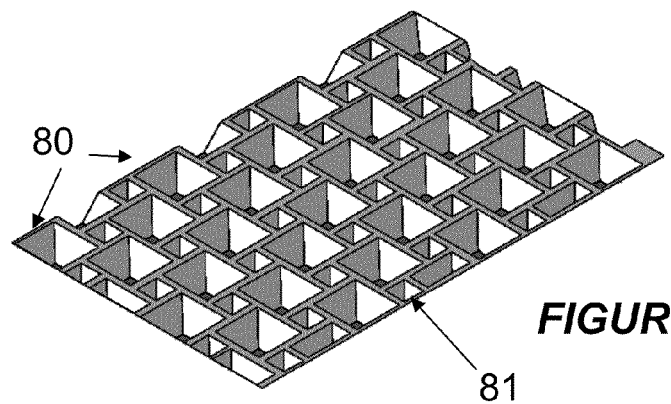
FIG. 8A, FIG. 8B, and FIG. 8C each show isometric views of a fully 3-dimensional substrate in comparison to a hybrid cell with planar sections.

FIG. 8A shows a conventional substrate having large aperture pyramids 80 and small aperture pyramids 81. The pyramids shown in this embodiment are square pyramids, but one of ordinary skill will realize that other options are possible as well. As shown, the flat areas where metallization will be applied are narrow and do not lie in linear regions. This may tend to increase the resistance of the metallization, reducing $J_{sc}$.

Figure 8B:
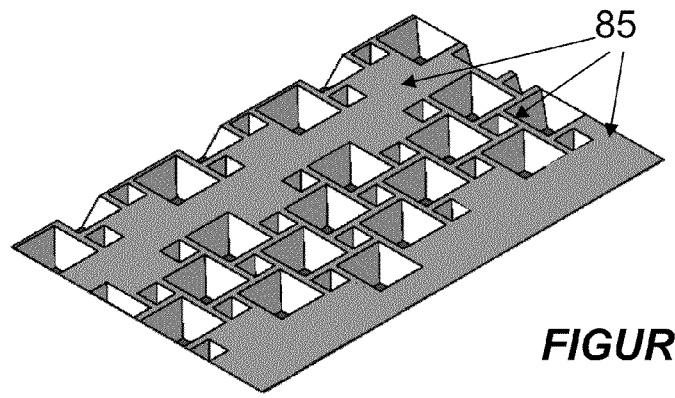

FIG. 8B shows a substrate in accordance with the present disclosure having large aperture pyramids and small aperture pyramids. Flat areas 85 lie not just on the boundaries between pyramids, but also in larger linear strips.

Figure 8C:
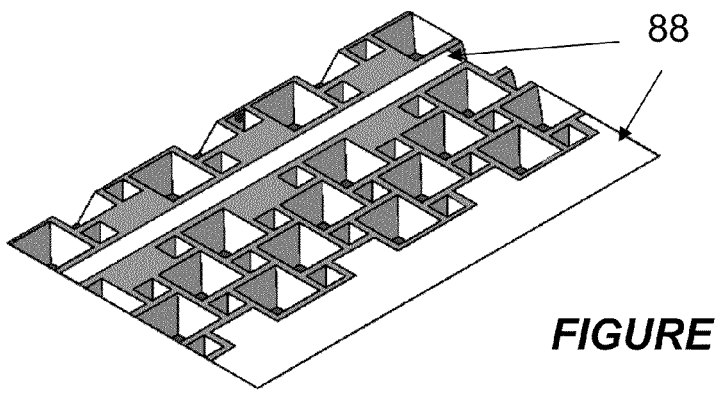

FIG. 8C shows the substrate of FIG. 8B after metallization 88 has been printed onto flat areas 85.

Figure 9A:
FIG. 9A, FIG. 9B, and FIG. 9C each show top down views and side views of a flat substrate and a fully 3-dimensional substrate in comparison to a hybrid cell with planar sections.

FIG. 9A shows views of a conventional flat substrate having metallization regions 90. This substrate suffers from high reflectance and low absorption problems, because of the lack of three-dimensional areas.

Figure 9B:
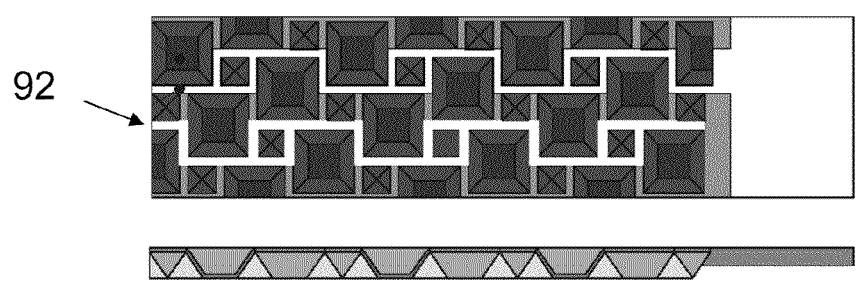

FIG. 9B shows views of a three-dimensional substrate similar to that shown in FIG. 8B and having the same shortcomings. Metallization 92 is restricted to the flat areas between pyramids.

Figure 9C:
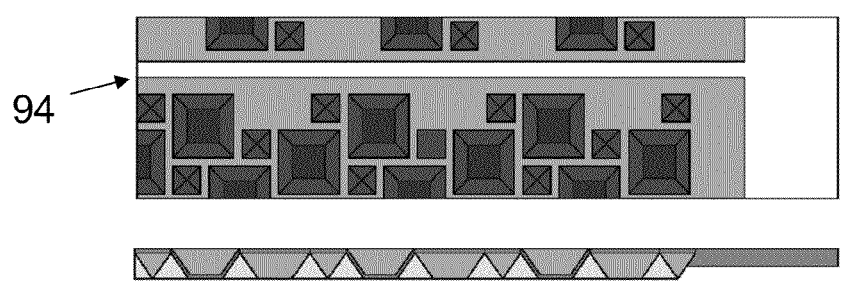

FIG. 9C shows views of a three-dimensional substrate with flat areas in accordance with the present disclosure, similar to that shown in FIG. 9C. Metallization 94 is applied to the linear flat sections in accordance with the present disclosure.

Embodiments of the present disclosure provide a TFSS released with the new mask. This TFSS may be more easily released in comparison to a full three dimensional surface mask. Embodiments have shown the mask having a full (125 mm in one instance) release.

Embodiments of the present disclosure provide reduced metal coverage (from 10-15%) for a ridge coated three dimensional cell to 6-8% for a hybrid topography cell which may have significant impact on $J_{sc}$ by reducing shading.

Embodiments of the present disclosure provide ease of screen print and nitride thickness control on flat areas. Fire through may tend to be uniform, due to uniform nitride and Ag thickness. This may help improve fill factor for given metal coverage.

Embodiments of the present disclosure provide a method of forming a thin film substrate with planar and three-dimensional topography areas. Aligning linear metallization regions with the planar areas may provide ease of contact formation as well as improved FF. Keeping three-dimensional textured areas for light trapping and restricting the metallization to planar areas may provide improved $J_{sc}$. Creating a free standing film substrate from a template wafer, thereby replicating the structures on the template without use of additional mask may provide additional advantages, such as reduced costs.

As one of ordinary skill in the art will appreciate, the term "substantially" or "approximately," as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of ordinary skill in the art will further appreciate, the term "operably coupled," as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (i.e., where one element is coupled to another element by inference) includes direct and indirect coupling between two elements in the same manner as "operably coupled." As one of ordinary skill in the art will further appreciate, the term "compares favorably," as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means- or step-plus-function elements in the claims below are intended to include any structure, material, or act for performing the function in combination with other claimed elements as specifically claimed. The description of the present disclosure has been presented for purposes of illustration and description, but it is not intended to be exhaustive or limited to the subject matter in the form disclosed.

Many modifications and variations will be apparent to those of ordinary skill in the art without departing from the scope and spirit of the present disclosure. The embodiments were chosen and described in order to best explain the principles of the present disclosure and the practical application, and to enable others of ordinary skill in the art to understand the disclosure for various embodiments with various modifications as are suited to the particular use contemplated.

What is claimed is:

1. A thin film silicon substrate comprising:
   a three dimensional structure defining a frontside and a backside of said substrate, said three dimensional structure comprising a mixture of a plurality of inverted pyramidal cavities and substantially flat areas;
   said substantially flat areas comprising:
      ridges forming base openings of said inverted pyramidal cavities; and
      planar linear regions across said substrate;
   said inverted pyramidal cavities comprising pyramidal sidewalls defining said pyramidal cavities from said ridges to pyramidal apices on said backside of said thin film substrate;
   said thin film silicon substrate forming said ridges, linear regions, pyramidal sidewalls, and pyramidal apices having a substantially uniform layer thickness;
   a first conductivity type forming doped base regions;
   an emitter region having a second conductivity type on said frontside of said substantially flat areas of said thin film substrate; and
   metallization on said substantially linear regions of said thin film substrate and contacting said emitter region, wherein said metallization covers at most approximately 8% of said thin film substrate frontside.

2. The substrate of claim 1, wherein said metallization covers at most approximately 6% of said frontside of said thin film substrate.

3. The substrate of claim 1, wherein said pyramids comprise small pyramids and large pyramids.

4. The substrate of claim 3, wherein said small and large pyramids are offset to prevent crack formation.

5. A thin film silicon substrate comprising:
   a three dimensional structure defining a frontside and a backside of said substrate, said three dimensional structure comprising a mixture of a plurality of inverted square pyramidal cavities and substantially flat areas, said plurality of inverted square pyramidal cavities comprising small square pyramids and large square pyramids arranged in an offset pattern;
   said substantially flat areas comprising:
      ridges forming base openings of said inverted pyramidal cavities; and
      planar linear regions across said substrate;
   said inverted pyramidal cavities comprising pyramidal sidewalls defining said pyramidal cavities from said ridges to pyramidal apices on said backside of said thin film silicon substrate;
   said thin film silicon substrate forming said ridges, linear regions, pyramidal sidewalls, and pyramidal apices having a substantially uniform layer thickness;
   a first conductivity type forming doped base regions;
   an emitter region having a second conductivity type on said frontside of said substantially flat areas of said thin film substrate; and
   metallization on said substantially linear regions of said thin film substrate and contacting said emitter region, wherein said metallization covers at most approximately 8% of said thin film substrate frontside.

6. The substrate of claim 5, wherein said metallization covers at most approximately 6% of said frontside of said thin film substrate.

7. The substrate of claim 1, wherein said substrate has a substantially uniform thickness less than 200 microns.

8. The substrate of claim 5, wherein said substrate has a substantially uniform thickness less than 200 microns.

* * * * *